(12) United States Patent
Smith

(10) Patent No.: US 8,530,817 B1
(45) Date of Patent: Sep. 10, 2013

(54) FIELD OF VIEW LIMIT DETECTION ENHANCEMENT FOR QUADRANT-ARRAY DETECTOR SYSTEMS

(75) Inventor: Sean M. Smith, Wilkes-Barre, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 383 days.

(21) Appl. No.: 12/606,527

(22) Filed: Oct. 27, 2009

Related U.S. Application Data

(60) Provisional application No. 61/108,741, filed on Oct. 27, 2008.

(51) Int. Cl.
*G01J 1/42* (2006.01)
*G01C 21/02* (2006.01)

(52) U.S. Cl.
USPC .................. 250/208.2; 250/206.1; 250/203.6

(58) Field of Classification Search
USPC ............... 250/208.2, 206.1, 206.2, 203.6
See application file for complete search history.

(56) References Cited

U.S. PATENT DOCUMENTS

| | | | | |
|---|---|---|---|---|
| 3,918,814 | A * | 11/1975 | Weiser | 356/620 |
| 4,142,098 | A * | 2/1979 | Korpel | 369/44.42 |
| 4,661,943 | A * | 4/1987 | Ikeda | 369/44.16 |
| 5,146,258 | A * | 9/1992 | Bell et al. | 396/234 |
| 5,708,638 | A * | 1/1998 | Braat et al. | 369/44.29 |
| 6,229,602 | B1 * | 5/2001 | Hirai et al. | 356/213 |
| 6,496,273 | B1 * | 12/2002 | Stimpson et al. | 356/614 |
| RE38,943 | E * | 1/2006 | Komma et al. | 359/19 |

* cited by examiner

*Primary Examiner* — Thanh Luu
(74) *Attorney, Agent, or Firm* — Withrow & Terranova, PLLC

(57) ABSTRACT

A method of making a device comprising one or more quadrant detectors (and such a detector) comprising fabricating a two-dimensional array of photodiodes and placing one or more photodiodes around the perimeter of the array.

11 Claims, 1 Drawing Sheet

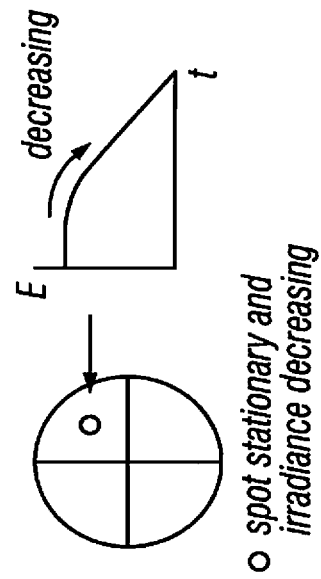
FIG. 2
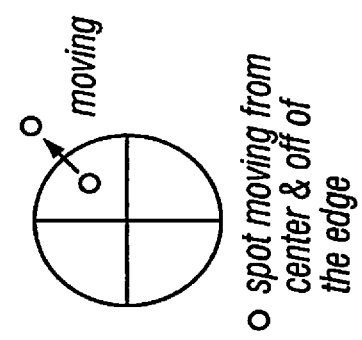
FIG. 4
FIG. 1 (PRIOR ART)
FIG. 3

FIELD OF VIEW LIMIT DETECTION ENHANCEMENT FOR QUADRANT-ARRAY DETECTOR SYSTEMS

CROSS-REFERENCE TO RELATED APPLICATIONS

This application claims priority to and the benefit of the filing of U.S. Provisional Patent Application Ser. No. 61/108,741, entitled "Field of View Limit Detection Enhancement for Quadrant-Array Detector Systems", filed on Oct. 27, 2008, and the specification and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to methods and apparatuses for field-of-view limit detection for optical devices such as quadrant-array detector systems.

2. Description of Related Art

Semi-active laser (SAL) seeker systems are usually subject to specific field of view requirements. These requirements will vary by system and application, but in general, they establish minimum, nominal, or maximum values for the field of view limit. In the case of a maximum limit, a method must be employed to ensure that no projectile guidance commands are issued when the target is beyond the specified field of view limit. Information about the position of the target relative to the field of view limit is required to comply with the requirement. The present invention provides this information, and allows the guidance processor to enable and disable guidance commands in accordance with the field of view requirement.

Existing solutions to this problem include placing a fixed physical barrier at and beyond the field of view limit, and terminating the active area of the quadrant detector at the field of view limit. Both of these solutions function by reducing the amount of signal that reaches the quadrant detector. The first method "shades" the detector through the use of an undersized aperture. The second reduces the amount of solid angle taken up by the quadrant detector within the optical field of view of the overall detector design.

Existing solutions are based on removing signal from the quadrant detector as the target moves out of the field of view. The simplicity of the quadrant detector permits accurate measurements of target position only when the image of the target spans more than one photocell. With the target near the edge of the field of view, the target image will generally be isolated to one photocell, or between two photocells with position detection in a direction parallel to the edge of the field of view. Under those conditions, the only information about target position provided by the basic quadrant detector is that it lies somewhere between the measurement region in the center and the outer edge of the detection region. The present invention provides positive indication that the target is either entering or exiting the seeker's field of view. This information may be used in enhanced target tracking and guidance algorithms. These advantages may be provided at a low cost using proven technology.

BRIEF SUMMARY OF THE INVENTION

The present invention is of a method of making a device comprising one or more quadrant detectors (and such a detector), comprising: fabricating a two-dimensional array of photodiodes; and placing one or more photodiodes around the perimeter of the array. In the preferred embodiment, the array is a two-by-two array, more preferably wherein the photodiodes placed around the perimeter of the array numbers only one, and most preferably wherein that one photodiode placed around the perimeter of the array is approximately circular. The detector can be interfaced with a semi-active laser seeker system. The detector can be employed to provide output allowing discrimination between a target moving off the edge of the detector and a target with decreasing irradiance, without using either a physical barrier at the field of view limit of the detector or termination of the active area of the detector as the field of view limit.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 1 is a diagram of a prior art quadrant detector;

FIG. 2 is a diagram of the detector of the invention;

FIG. 3 is a diagram of the problem posed by a target moving off the edge of a quadrant; and FIG. 4 is a diagram of the problem posed by decreasing irradiance of a target.

DETAILED DESCRIPTION OF THE INVENTION

The present invention is of an apparatus and method improving field-of-view (FOV) limit detection. Referring to one embodiment, a quadrant detector photodiode array normally consists of four large-area diodes fabricated on a common substrate in a pie-wedge pattern. The diodes are electrically independent from one another to a substantial degree due to the inclusion of inactive regions of silicon between the wedges. Most arrays have a circular perimeter, but other perimeter shapes are used in various applications. The present invention provides the most benefit to quadrant detectors with circular perimeters, but it may also be used with these other shapes. The present invention is of the addition of one or more (preferably one) independent diodes (or active region) around the perimeter of the array.

Referring to FIG. 1, a prior art quadrant detector 10 consists of four independent large-area photodiodes 1,2,3,4 arrayed on a common substrate in a pie-wedge pattern. As shown in FIG. 2, the present invention 20 includes the addition of a fifth, independent photodiode 5 around the perimeter of the array (width is exaggerated in figure).

Semi-active laser (SAL) seeker systems are usually subject to specific field of view requirements. These requirements will vary by system and application, but in general, they establish minimum, nominal, or maximum values for the field of view limit. An example of a maximum limit is a method to ensure that no projectile guidance commands are issued when a laser-designated target is beyond the specified field of view limit. Information about the position of the target relative to the field of view limit is required to comply with the requirement. The present invention provides the information directly and unambiguously, allowing the guidance processor to enable and disable guidance commands in strict accordance with the field of view requirement.

Existing solutions are based on reducing signal from the quadrant detector as the target moves out of the field of view. The simplicity of the quadrant detector permits accurate measurements of target position only when the image of the target spans more than one photocell. With the target near the edge of the field of view, the target image will generally be isolated to one photocell, or between two photocells with position detection in a direction parallel to the edge of the field of view. Under those conditions, the only information about target position provided by the basic quadrant detector is that it lies somewhere between the measurement region in the center and the outer edge of the detection region.

Existing solutions to this problem include placing a fixed physical barrier at and beyond the field of view limit, and terminating the active area of the quadrant detector at the field of view limit. Both of these solutions function by reducing the amount of signal that reaches the quadrant detector. The first method "shades" the detector through the use of an undersized aperture. The second reduces the amount of solid angle taken up by the quadrant detector within the optical field of view of the overall detector design.

One other possible solution is to use a detector with continuous position detection capabilities. These are generally much more expensive than quadrant detectors and their response to the typical input signal is not as good. Another possible solution is to make the image of the target signal large enough to fall mostly within one photocell, but also into an adjacent photocell and across the field of view limit at the same time. The major drawback to this approach is that the maximum field of view achievable with this approach is very small.

The present invention provides positive indication that the target is either entering or exiting the seeker's field of view. This information may be used in enhanced target tracking and guidance algorithms. These advantages may be provided at a low cost using proven technology. The present invention provides field-of-view compliance by eliminating dependence on received irradiance. The prior art cannot tell the difference between the situations in FIGS. 3 and 4, with the former being relevant to field-of-view and the latter not.

While the preferred embodiment of the invention is directed to laser-guided weapons, the invention is also useful in other optical guidance systems for vehicles, robots, and other machines of any sort using optical guidance or analysis, particularly those requiring position control limit detection and/or laser beam centering limit detection.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. Note that in the specification and claims, "about" or "approximately" means within twenty percent (20%) of the numerical amount cited. The entire disclosures of all references, applications, patents, and publications cited above are hereby incorporated by reference.

What is claimed is:

1. A quadrant detector consisting substantially of:
   a two-by-two array of photodiodes having a circular perimeter;
   a single annular photodiode having an area that abuts and surrounds the circular perimeter of said array; and
   wherein said quadrant detector provides output without using either a physical barrier at a field of view limit of the quadrant detector or termination of an active area of the quadrant detector as the field of view limit.

2. The quadrant detector of claim 1 wherein said detector is compatible with a semi-active laser seeker system.

3. The quadrant detector of claim 1 wherein said detector provides output allowing discrimination between a target moving off the edge of the detector and a target with decreasing irradiance.

4. The quadrant detector of claim 1 consisting of the two-by-two array of photodiodes and the single annular photodiode placed around the circular perimeter of said array.

5. A method of making a device comprising a quadrant detector, the method comprising the steps of:
   fabricating a two-by-two array of photodiodes having a circular perimeter; and
   placing the two-by-two array of photodiodes having the circular perimeter within a single annular photodiode, such that an area of the annular photodiode abuts and surrounds the circular perimeter of the array; and
   employing the quadrant detector to provide output without using either a physical barrier at a field of view limit of the quadrant detector or termination of an active area of the quadrant detector as the field of view limit.

6. The method of claim 5 additionally comprising the step of interfacing the quadrant detector with a semi-active laser seeker system.

7. The method of claim 5 additionally comprising the step of employing the quadrant detector to provide output allowing discrimination between a target moving off the edge of the quadrant detector and a target with decreasing irradiance.

8. The method of claim 5 wherein the resulting quadrant detector consists of the two-by-two array of photodiodes and the single annular photodiode placed around the circular perimeter of the array.

9. A guidance system having a field-of-view (FOV), comprising:
   a guidance processor; and
   a quadrant detector coupled to the guidance processor, comprising:
      a two-by-two array of photodiodes having a circular perimeter;
      an annular photodiode that comprises an area that abuts and surrounds the circular perimeter; and
   wherein the guidance processor is configured to:

receive a first signal indicating that a photodiode in the two-by-two array of photodiodes received electromagnetic radiation from a source;

receive a second signal indicating that the surrounding annular photodiode received electromagnetic radiation from the source; and based on the first signal and the second signal, determine that the source is moving into the FOV or moving out of the FOV.

10. The guidance system of claim 9, wherein the guidance processor is further configured to initially receive the first signal at a first time, and initially receive the second signal at a second time that is after the first time, and determine that the source is moving out of the FOV.

11. The guidance system of claim 9, wherein the guidance processor is further configured to initially receive the second signal at a first time, and initially receive the first signal at a second time that is after the first time, and determine that the source is moving into the FOV.

\* \* \* \* \*